United States Patent [19]
Cosimini et al.

[11] 4,418,400
[45] Nov. 29, 1983

[54] DATA TRACK FOR CROSS TIE WALL MEMORY SYSTEM

[75] Inventors: Gregory J. Cosimini, St. Paul; David S. Lo, Burnsville; Maynard C. Paul, Bloomington, all of Minn.

[73] Assignee: Sperry Corporation, New York, N.Y.

[21] Appl. No.: 218,993

[22] Filed: Dec. 22, 1980

[51] Int. Cl.³ .............................................. G11C 19/08
[52] U.S. Cl. ......................................... 365/87; 365/58
[58] Field of Search ....................... 365/37, 58, 87, 88, 365/171

[56] References Cited

U.S. PATENT DOCUMENTS

| | | | |
|---|---|---|---|
| 3,438,006 | 4/1969 | Spain | 365/88 |
| 4,040,040 | 8/1977 | Torre | 365/37 |
| 4,199,819 | 4/1980 | Schwee et al. | 365/87 |
| 4,250,565 | 2/1981 | Cosimini et al. | 365/87 |

Primary Examiner—James W. Moffitt
Attorney, Agent, or Firm—Kenneth T. Grace; Marshall M. Truex

[57] ABSTRACT

An improved magnetic memory system in which binary data are stored as cross-tie, Bloch-line pairs, which are serially propagated downstream along a cross-tie wall in a magnetizable layer by appropriate drive fields. The magnetizable layer is configured into a data track whose two opposing edges are formed into patterns of asymmetrically shaped edges which form successive narrow portions with wide portions therebetween, and which are formed about the geometric centerline of the data track. The improvement comprises forming a plurality of energy wells along the geometric centerline of the data track and, transverse to the geometric centerline of the data track in the areas of the narrow portions where the cross-ties are stored but not in the areas of the geometric centerline.

5 Claims, 7 Drawing Figures

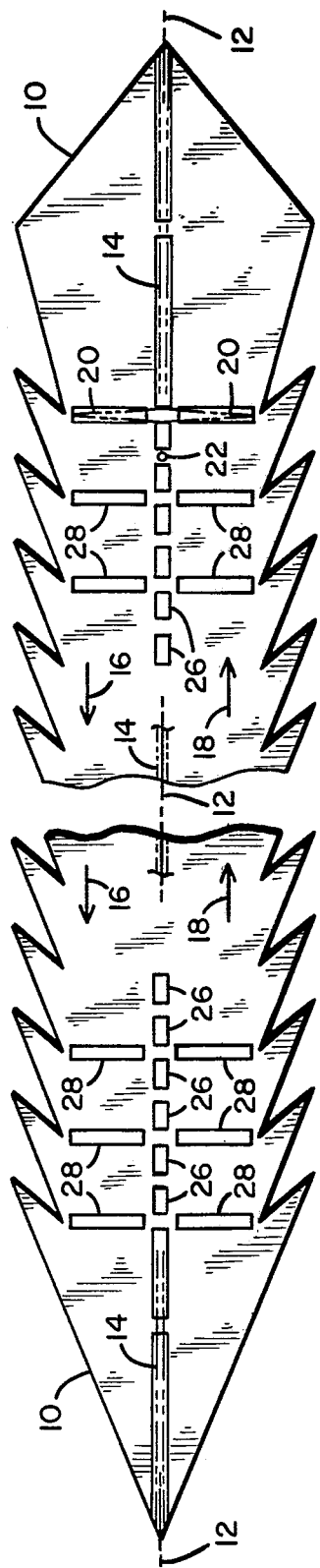
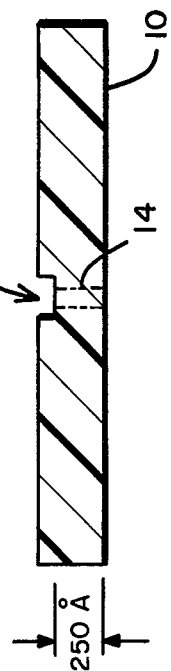
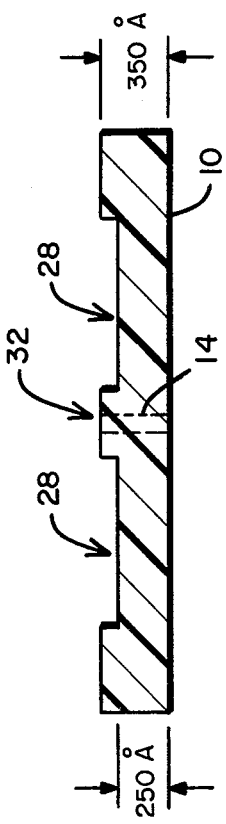
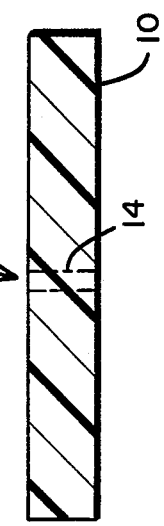

DATA TRACK FOR CROSS TIE WALL MEMORY SYSTEM

BACKGROUND OF THE INVENTION

The propagation of inverted Néel wall sections in a serial access memory system was proposed by L. J. Schwee in the publication "Proposal on Cross-Tie Wall and Bloch-line Propagation in Thin Magnetic Films," IEEE Transactions On Magnetics, Mag 8, #3, Pages 405–407, September 1972. Such a memory system utilizes a ferro magnetic film of approximately 81% Ni-19% Fe approximately 350 Angstroms (Å) thick in which cross-tie walls can be changed to Néel walls and Néel walls can be changed to cross-tie walls by applying appropriate fields. Associated with the cross-tie walls is a section of inverted Neel wall that is bounded by a cross-tie on one end and a Bloch-line on the other end.

In such a cross-tie wall memory system, information is entered in one end of the serial access memory system by the generation of an inverted Néel wall section, formed by a cross-tie on one side and a Bloch-line on the other, that is representative of the stored binary 1 or of a non-inverted Néel wall section, (i.e., the absence of a cross-tie, Bloch-line pair) that is representative of a stored binary 0). Such information is moved or propagated along the cross-tie wall by the successive generation, and then the selective annihilation, of inverted Néel wall sections at successive memory cells along the cross-tie wall. In the L. J. Schwee U.S. Pat. No. 3,868,660 and in the publication "Cross-Tie Memory Simplified by the Use of Serrated Strips," L. J. Schwee, et al., AIP Conference Proceedings, No. 29, 21st Annual Conference on Magnetism and Magnetic Materials, 1975, published April 1976, pages 624–625, and in the publication "Cross-Tie/Bloch-Line Detection" G. J. Cosimini, et al., AIP Conference Proceedings, No. 3, 23rd Annual Conference on Magnetism and Magnetic Materials, 1978, published March 1978, pages 1828–1830, there have been published some more results of the further development of Cross-Tie Memory Systems.

In most prior art cross-tie memory systems, the magnetic film that functions as a storage medium has the property of uniaxial anisotropy provided by its easy axis induced magnetic fields, which easy axis is generated in the magnetic film during its formation in the vapor deposition process. This easy axis provides a magnetic field induced anisotropy that constrains the generation of the cross-tie wall along and parallel to the easy axis. In the above referenced L. J. Schwee, et al., AIP Publication, there are proposed serrated strips of Permalloy film, about 350 Å in thickness and 10 microns (μm) in width, which serrated strips are etched from a planar layer of magnetic material so that the strips are aligned along the easy axis of the film. After an external magnetic field is applied normal to the strip length, i.e., transverses the easy axis of the film, the magnetization along the opposing serrated edges rotates back to the nearest direction that is parallel to the edge. This generates two large domains that are separated by a Néel or cross-tie wall that is formed along the centerline of the strip. Cross-ties are energetically more stable at the energy wells formed by the necks or narrow portions of the serrated strips, while Bloch-lines are energetically more stable at the energy wells formed by the wide portions between adjacent necks, or narrow portions.

In the G. J. Cosimini, et al., patent application, Ser. No. 20,762, filed Feb. 23, 1979, now U.S. Pat. No. 4,250,565, the disclosure of which is herein incorporated by reference, there is disclosed a cross-tie wall memory system that is comprised of a shift register for shifting cross-tie, Bloch-line pairs therealong through a plurality of memory cells consisting of a transfer section and a store section. The shift register is terminated on one end by a cross-tie, Bloch-line pair generator, for selectively coupling cross-tie, Bloch-line pairs to the shift register, and on the other end by a detector for detecting when a cross-tie has been entered therein from the shift register.

The generator/shift register/detector assembly of G. J. Cosimini, et al., is fabricated in three superposed layers: a straight-edged current conductive strip line; a serrated-edged thin magnetic layer that forms the data track along the geometric centerline of which is formed and structured the cross-tie wall, and a wide-narrow-edged current conductive strip line comprised of a plurality of rectangularly shaped wide portions that are serially coupled by narrow portions therebetween that is terminated on one end by a cross-tie, Bloch-line pair generator and on the other end by a cross-tie detector. Electronic circuitry controls the current drive signals to the straight-edged strip line and/or the wide-narrow-edged strip line to generate the necessary fields for the propagation of the cross-tie, Bloch-line pairs along the serrated-edged data track, to the generator to selectively generate, or not, cross-tie, Bloch-line pairs, and to the detector to detect the presence, or not, of a cross-tie, all in synchronism. The present invention is considered to be an improvement of the design of the magnetic data track of G. J. Cosimini, et al.

SUMMARY OF THE INVENTION

In the present invention there is provided further means within the design of the data track of G. J. Cosimini, et al.—further with respect to the narrow portions of the data track at which the cross-ties are more energetically stable and the downstream wide portions at which the associated Bloch-lines are more energetically stable—for structuring the binary data representing cross-tie, Bloch-line pairs along and within the data track. This improvement consists of the addition of areas of decreased data track thickness along the data track for forming energy wells that provide an increased cross-tie, Bloch-line pair resistance to deleterious movement away from the centerline of the data track and/or along the cross-tie wall. Energy wells are formed between opposing necks or within the narrow portions of the data track, transverse the data track's centerline, between adjacent narrow portions of the data track but not in the areas of the cross-tie or the Bloch-line, for producing a magnetostatically favorable position for a Bloch-line thereat. These energy wells provide an increased resistance to the creep or movement of the cross-tie wall, and the associated cross-tie, Bloch-line pairs, when subjected to repetitive memory drive field cycling, and a correspondingly improved memory operation.

BRIEF DESCRIPTION OF THE DRAWINGS

FIG. 1 is a plan view of the data track of the present invention illustrating the positioning of the energy wells spaced along the center line of the data track and transverse the data track in the areas of the narrow portions thereof.

FIG. 3 is an illustration of a cross-section of the data track of FIG. 2 taken along line 3—3 thereof illustrating the positioning of the energy wells transverse the data track's centerline in the area of the narrow portion thereof.

FIG. 4 is an illustration of a cross-section of the data track of FIG. 2 taken along line 4—4 thereof illustrating the positioning of the energy wells that are oriented along the centerline of the data track.

FIG. 5 is an illustration of a cross-section of the data track of FIG. 2 taken along line 5—5 thereof illustrating the wide portion of the data track between adjacent energy wells along the centerline of the data track wherein the Bloch-line is oriented.

DESCRIPTION OF THE PREFERRED EMBODIMENT

Figure 2:
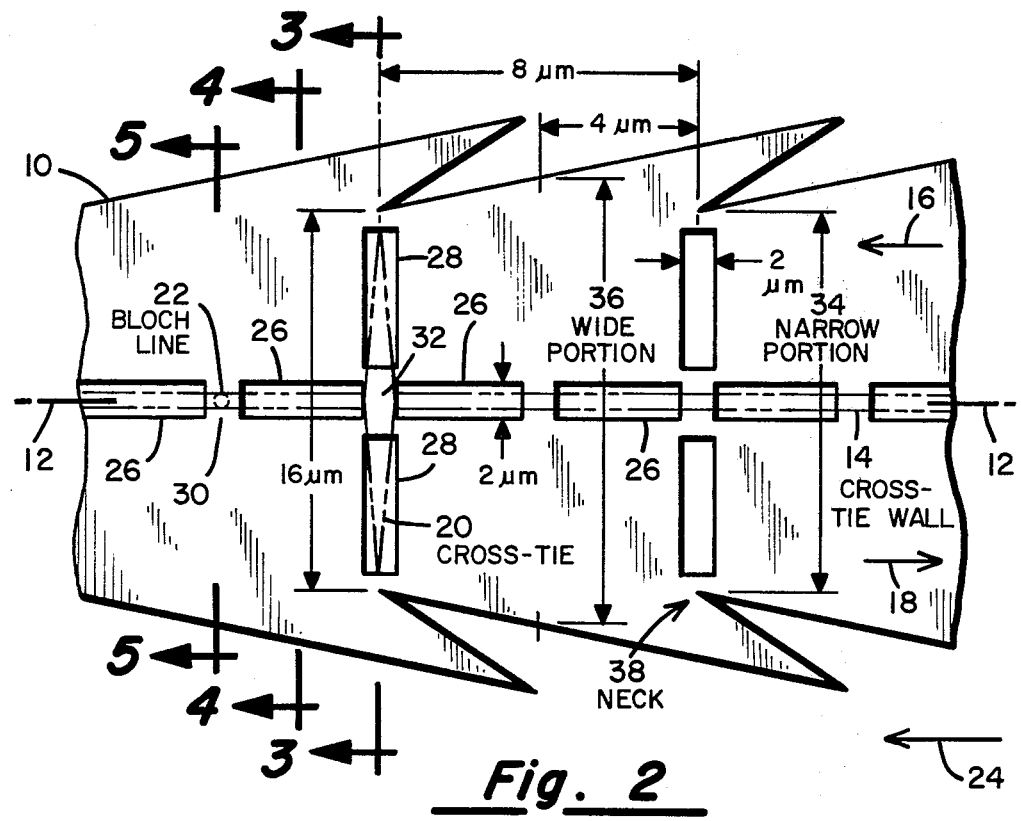
FIG. 2 is an enlarged illustration of a portion of the data track of FIG. 1 illustrating the positioning of the energy wells within the data track.

With particular reference to FIG. 1, there is presented an illustration of a magnetizable data track 10 such as that of the hereinabove referenced G. J. Cosimini, et al, patent into which the present invention has been incorporated. Data track 10 is formed of a layer of 81% Ni-19% Fe and of a thickness in the range 250 Å–400 Å but preferably of 350 Å thick, that is configured into a strip whose two opposing edges are formed into mirror-imaged, uniformly spaced, repetitive patterns of asymmetrically shaped edges which repetitive patterns are formed of successive narrow portions forming wide portions therebetween and which are formed about the geometric centerline 12 of the strip. As is well known, such data track 10 when affected by the proper drive fields establishes a cross-tie wall 14 along its geometric center line 12. Preferably, the film strip forming data track 10 is isotropic, i.e., has substantially zero magnetic field induced anisotropy, and utilizes its shape, i.e., its edged contour, to constrain cross-tie wall 14 within the planar contour of and along the geometric centerline or longitudinal axis 12 of data track 10. On the collapse of the drive fields that establish the cross-tie wall 14 along the geometric centerline 12, the magnetization in data track 10 is established in two anti-parallel directions about the cross-tie wall 14 as denoted by arrows 16 and 18. This mechanism for the establishment of the anti-parallel magnetic domains above and below the cross-tie wall 14 is more fully discussed in the L. H. Johnson, et al., U.S. Pat. No. 4,075,612. Propagation of the cross-tie 20, Bloch-line 22 pair is from right to left in the downstream direction as denoted by arrow 24.

In the prior art, as in the hereinabove referenced G. J. Cosimini, et al., patent, data track 10 is configured into a strip whose two opposing edges are mirror-imaged, uniformly spaced, repetitive patterns of asymmetrically shaped edges which repetitive patterns are formed of successive narrow portions forming wide portions therebetween. These narrow portions provide areas in data track 10 at which the cross-ties 20 are more energetically stable than at any other position, such as at the wide portions between the adjacent narrow portions within data track 10. The wide portions between adjacent narrow portions provide areas at which the Bloch-lines are more energetically stable, than at the successive narrow portions, than any other area within data track 10. Thus, the geometric conformation of the opposing edge patterns of data track 10 establishes areas at which the cross-tie, Bloch-line pairs are more energetically stable than any other position within data track 10. However, it has been determined that successive applications of drive fields to data track 10 cause cross-tie wall 14 and the associated cross-tie 20, Bloch-line 22 pairs therealong to move away from their initially most energetically stable states.

The present invention includes the following:

forming a plurality of energy wells along the geometric centerline of the data track but not in the areas of the narrow portions and the wide portions where the cross-tie and the Bloch-line, respectively, are stored; and, forming a plurality of energy wells transverse the geometric centerline of the data track in the areas of the narrow portions where said cross-ties are stored but not in the areas of the geometric centerline.

Energy wells 26 and 28 are formed in the magnetizable layer of 81% Ni-19% Fe of 350 Å in thickness of which data track 10 is formed by, e.g., an ion milling technique in the top surface thereof—see the publication "Microstructure Arrays Produced By Ion Milling", E. G. Spencer, et al., Journal of Applied Physics, Volume 17, #8, Oct. 15, 1970, pages 328-332—or by any of many other various techniques, such as chemical etching.

With particular reference to FIG. 2, there is presented an enlarged view of a portion of data track 10 illustrating in greater detail the planar conformation of energy wells 26 and 28 and their orientation within data track 10. A plurality of energy wells 26 are formed along the geometric centerline 12 of data track 10 but not in the areas of the narrow portions 34 and the wide portions 36 of data track 10 where cross-ties 20 and Bloch-lines 22, respectively, are stored in their most energetically stable state. Additionally, a plurality of energy wells 28 are formed in data track 10, transverse to the geometric centerline 12 of data track 10, only in the areas of the narrow portions 34 of data track 10 where the cross-ties 20 are stored in their most energetically stable state but not in the areas of the geometric centerline 12. As illustrated in FIG. 2, the gaps 30 between adjacent energy wells 26 establish relatively fixed positions for Bloch-lines 22 while at rest, while gaps 32 between adjacent longitudinal energy wells 26 and transverse energy wells 28 establish relatively fixed positions for cross-ties 20 when at rest. These gaps 30 and 32 and their associated energy wells 26 and 28, respectively, establish substantially improved atrest positions for the Bloch-line 22, cross-tie 20 pairs during their propagation through data track 10 in their downstream direction denoted by arrow 24 when subjected to the proper drive fields, all as taught in the herein above referenced G. J. Cosimini, et al., patent.

With particular reference to FIG. 3, there is presented an illustration of a cross section of data track 10 of FIG. 2 taken along line 3—3 thereof illustrating the cross-sectional contour of the energy wells 28 along the narrow portion 34 of data track 10. As discussed herein above, energy wells 28 and 26 may be formed by an ion milling technique wherein sufficient material is removed from the top surface of data track 10 to form grooves 28 (and 26) having a depth of ≃100 Å and leaving a minimum thickness of 250 Å in data track 10.

With particular reference to FIG. 4, there is presented an illustration of a cross section of data track 10 of FIG. 2 taken along line 4—4 thereof illustrating the cross-sectional contour of data track 10 in the areas between adjacent wide portions 36 and narrow portions 34 of data track 10.

With particular reference to FIG. 5 there is presented an illustration of a cross section of data track 10 of FIG. 2 taken along line 5—5 thereof illustrating the cross-sectional contour of data track 10 in the area of the wide portion 36 between adjacent narrow portions 34 and in the area of gap 30 between adjacent energy wells 26.

Figure 6:
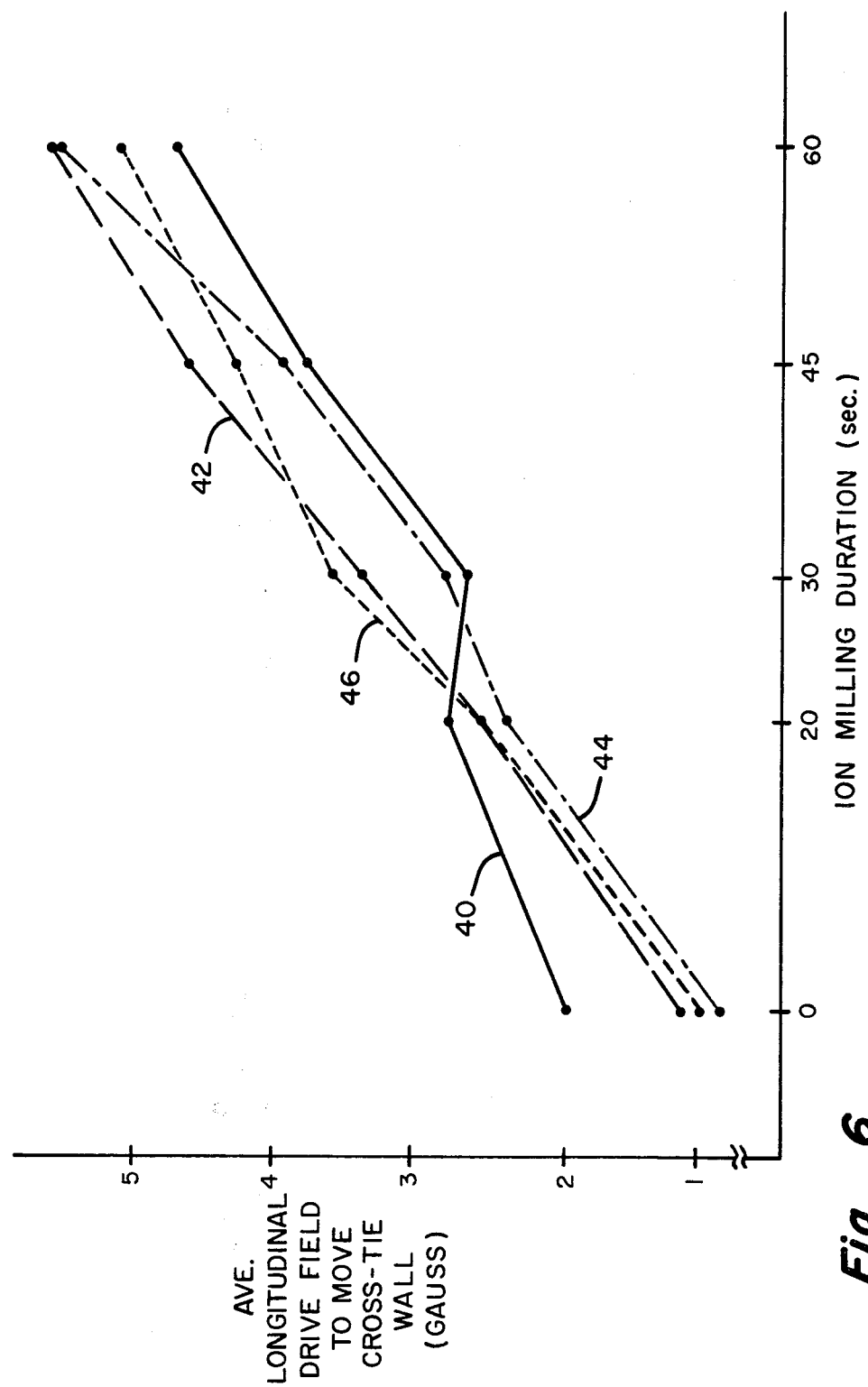
FIG. 6 is a plot of average longitudinal drive field intensity versus ion milling time duration to move a cross-tie wall away from the centerline of the data track.

With particular reference to FIG. 6 there is presented a plot of average longitudinal drive field—parallel to geometric centerline 12—intensity required to move the cross-tie wall 14 away from its initial position along geometric centerline 12 versus ion milling duration, which at 60 seconds is equal to an energy well depth of approximately 100 Å. The data were taken using a data track 10 of approximately 81% Ni-19% Fe, 330 Å in thickness in which the noted curves were taken from a data track 10 having the noted narrow portion dimensions and with the necks 38 being sharp—as in FIG. 2—or rounded:

Curve 40—14 μm wide narrow portion 34 with rounded neck 38.
Curve 42—14 μm wide narrow portion 34 with sharp neck 38.
Curve 44—16 μm wide narrow portion 34 with sharp neck 38.
Curve 46—19 μm wide narrow portion 34 with rounded neck 38.

FIG. 6 illustrates that an increasing energy well depth i.e., an increasing ion milling duration, causes a corresponding (approximately linear) increase in the intensity of the longitudinal drive field that is necessary to move the cross-tie wall 14 away from the geometric centerline 12 of data track 10. Accordingly, it has been shown that the use of the energy wells 26 and 28 as spaced along and about the cross-tie wall 14 in data track 10 provides a cross-tie wall memory system that is substantially less susceptible to a degrading operation due to repetitive, i.e., 10,000,000 memory drive field propagation cycles.

Figure 7:
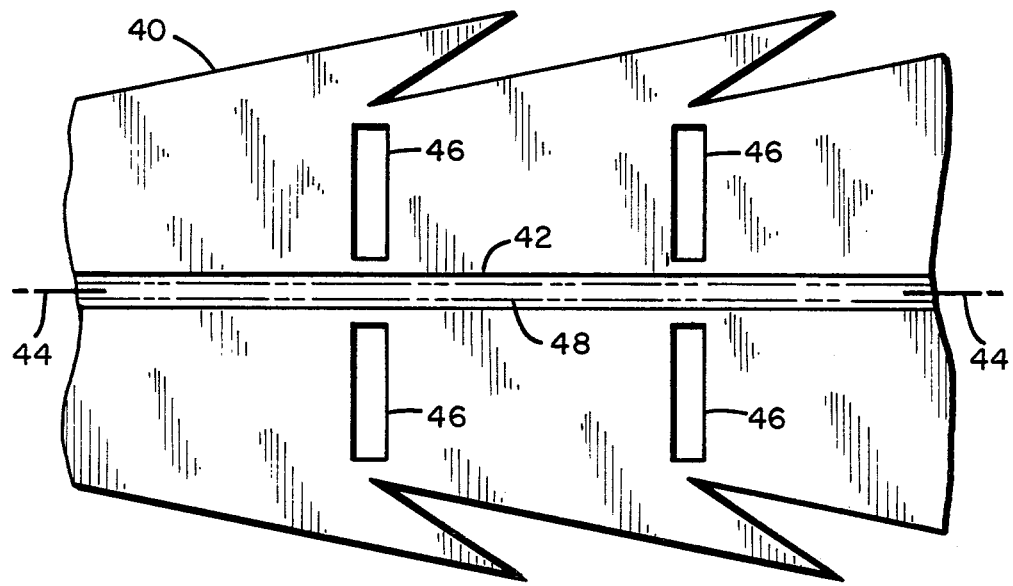
FIG. 7 is a plan view of a data track similar to that of FIG. 1 in which the energy well along the centerline of the data track is continuous.

With particular reference to FIG. 7 there is presented an illustration of a magnetizable data track 40 similar to that of data track 10 of FIG. 1 in which the energy wells 46 are transverse, but not in the area of, the geometric centerline 44, or the cross-tie wall 48, of data track 40, but in which the energy well 42 is continuous along the geometric centerline 44.

What is claimed is:

1. In a magnetic memory system in which binary data are stored as inverted Néel wall sections about the Bloch-lines of associated cross-tie, Bloch-line pairs, which cross-tie, Bloch-line pairs are generated in and are serially propagated downstream along a cross-tie wall in a magnetizable layer by appropriate drive fields, said magnetizable layer being configured into a data track forming strip whose two opposing edges are formed into mirror-imaged, uniformly spaced, repetitive patterns of asymmetrically shaped edges which repetitive patterns are formed of successive narrow portions, forming wide portions therebetween, and which are formed about the geometric centerline of the data track for establishing said cross-tie wall along said geometric centerline and structuring each of said cross-ties along said cross-tie wall and at a narrow portion of said data track and the associated Bloch-line at the next adjacent downstream wide portion of said data track, the improvement comprising:

forming a plurality of energy wells along the geometric centerline of said data track but not in the areas of said narrow portions and said wide portions where said cross-ties and said Bloch-lines, respectively, are stored;

forming a plurality of energy wells transverse said geometric centerline in the areas of said narrow portions where said cross-ties are stored but not in the areas of said geometric centerline;

forming a continuous cross-tie wall along said geometric centerline and within said plurality of energy wells that are formed along said geometric centerline; and, forming two large domains of opposite polarity on opposite sides of said continuous cross-tie wall, the polarities of which are parallel to said continuous cross-tie wall.

2. The improvement of claim 1 in which said energy wells are formed in the surface of said data track by removing a portion thereof for forming said energy wells as grooves in said data track.

3. The improvement of claim 2 in which the depths of said grooves in said data track leave a minimum thickness of 250 Å of said magnetizable layer.

4. In a magnetic memory system in which binary data are stored as inverted Néel wall sections about the Bloch-lines of associated cross-tie, Bloch-line pairs, which cross-tie, Bloch-line pairs are generated in and are serially propagated downstream along a cross-tie wall in a magnetizable layer by appropriate drive fields, said magnetizable layer being configured into a data track forming strip whose two opposing edges are formed into mirror-imaged, uniformly spaced, repetitive patterns of asymmetrically shaped edges which repetitive patterns are formed of successive narrow portions, forming wide portions therebetween, and which are formed about the geometric centerline of the data track for establishing said cross-tie wall along said geometric centerline of the data track for establishing said cross-tie wall along said geometric centerline and structuring each of said cross-ties along said cross-tie wall and at a narrow data track and the associated Bloch-line at the next adjacent, downstream wide portion of said data track, the improvement comprising:

forming a continuous energy well along the geometric centerline of said data track;

forming a continuous cross-tie wall along said geometric centerline and within said continuous energy well;

forming two large domains of opposite polarity on opposite sides of said continuous cross-tie wall, the polarities of which are parallel to said cross-tie wall; and forming a plurality of energy wells transverse the geometric centerline of said data track in the areas of said narrow portions where said cross-ties are stored but not in the area of said continuous energy well.

5. The improvement of claim 4 in which said energy well is formed in the surface of said data track by removing a portion thereof for forming said energy well as a groove in said data track.

* * * * *